(12) United States Patent
Howald et al.

(10) Patent No.: US 6,441,555 B1
(45) Date of Patent: Aug. 27, 2002

(54) PLASMA EXCITATION COIL

(75) Inventors: Arthur M. Howald, Pleasanton; Brian McMillin; Frank Yun Lin, both of Fremont, all of CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 09/539,906

(22) Filed: Mar. 31, 2000

(51) Int. Cl.$^7$ .................................................. H01J 7/24
(52) U.S. Cl. ............................... 315/111.51; 118/723 I; 156/345
(58) Field of Search .................. 315/111.21, 111.51, 315/111.81; 118/723 I; 219/121; 156/345

(56) References Cited

U.S. PATENT DOCUMENTS

| | | | |
|---|---|---|---|
| 4,849,675 A | * 7/1989 | Miller | 315/111.51 |
| 4,948,458 A | 8/1990 | Ogle | 438/729 |
| 5,226,967 A | 7/1993 | Chen et al. | 134/17 |
| 5,277,751 A | 1/1994 | Ogle | 216/70 |
| 5,304,279 A | 4/1994 | Coultas et al. | 156/345 |
| 5,368,710 A | 11/1994 | Chen et al. | 204/192.32 |
| 5,368,967 A | 11/1994 | Schank et al. | 430/58.3 |
| 5,401,350 A | 3/1995 | Patrick et al. | 156/345 |
| 5,558,722 A | 9/1996 | Okumura et al. | 118/723 I |
| 5,731,565 A | 3/1998 | Gates | 219/121.54 |
| 5,759,280 A | 6/1998 | Holland et al. | 118/723 F |
| 5,759,429 A | 6/1998 | Trimmer et al. | 249/196 |
| 5,795,429 A | 8/1998 | Ishii et al. | 156/345 |
| 5,800,619 A | 9/1998 | Holland et al. | 118/723 I |
| 5,897,713 A | * 4/1999 | Tomioka et al. | 315/111.51 |
| 5,964,949 A | * 10/1999 | Savas | 118/723 I |
| 6,028,285 A | * 2/2000 | Khater et al. | 219/121.43 |
| 6,331,754 B1 | * 12/2001 | Satoyoshi et al. | 315/111.51 |
| 6,353,206 B1 | * 3/2002 | Roderick | 315/111.51 |

* cited by examiner

Primary Examiner—Don Wong
Assistant Examiner—Jimmy T. Vu
(74) Attorney, Agent, or Firm—Lowe Hauptman Gilman & Berner, LLP (57) ABSTRACT

A spiral-like multi-turn coil excites a plasma for treating a workpiece in a vacuum plasma processor. In one embodiment two of the turns have a discontinuity. Each discontinuity has a capacitor connected across it. An RF source drives the coil via a matching network, an inductor connected to one coil excitation terminal and a capacitor connected to another coil excitation terminal. The impedances of the inductors and the capacitors at the RF source frequency and the discontinuity locations are such as to cause a standing wave voltage of the coil to have (1) equal and opposite values at the coil terminals, (2) sudden amplitude and slope changes, slope reversals and polarity reversals at each of the discontinuities, and (3) three gradual standing wave voltage polarity reversals, spaced from each other by 120°. Two of the gradual polarity reversals are azimuthally aligned with the discontinuities. In a second embodiment, one turn has a discontinuity having a series capacitor connected across it. A shunt capacitor is connected between the discontinuity and ground.

39 Claims, 7 Drawing Sheets

PLASMA EXCITATION COIL

FIELD OF THE INVENTION

The present invention relates generally to plasma excitation coils and, more particularly, to an excitation coil having at least one capacitance connected across a discontinuity between the coil excitation terminals, and to a workpiece processor including such a coil. The invention also relates to a method of operating an excitation coil such that a standing wave has a sudden amplitude and slope change, as well as a sudden slope reversal, between the coil excitation terminals.

BACKGROUND ART

One type of processor for treating workpieces with an RF plasma in a vacuum chamber includes a coil responsive to an RF source. The coil responds to the RF source to produce electromagnetic fields that excite ionizable gas in the chamber to a plasma. Usually the coil is on or adjacent to a dielectric window that extends in a direction generally parallel to a planar horizontally extending surface of the processed workpiece. The excited plasma interacts with the workpiece in the chamber to etch the workpiece or to deposit material on it. The workpiece is typically a semiconductor wafer having a planar circular surface or a solid dielectric plate, e.g., a rectangular glass substrate used in flat panel displays, or a metal plate.

Ogle, U.S. Pat. No. 4,948,458 discloses a multi-turn spiral coil for achieving the above results. The spiral, which is generally of the Archimedes type, extends radially and circumferentially between its interior and exterior terminals connected to the RF source via an impedance matching network. Coils of this general type produce oscillating RF fields having magnetic and capacitive field components that propagate through the dielectric window to heat electrons in the gas in a portion of the plasma in the chamber close to the window. The oscillating RF fields induce in the plasma currents that heat electrons in the plasma. The spatial distribution of the magnetic field in the plasma portion close to the window is a function of the sum of individual magnetic field components produced by each turn of the coil. The magnetic and electric field components produced at each point along the coil are respectively functions of the magnitude of RF current and voltage at each point. The current and voltage differ for different points because of transmission line effects of the coil at the frequency of the RF source.

For spiral designs as disclosed by and based on the Ogle '458 patent, the RF currents in the spiral coil are distributed to produce a torroidal shaped magnetic field region in the portion of the plasma close to the window, which is where power is absorbed by the gas to excite the gas to a plasma. At low pressures, in the 1.0 to 10 mTorr range, diffusion of the plasma from the ring shaped region produces plasma density peaks just above the workpiece in central and peripheral portions of the chamber, so the peak densities of the ions and electrons which process the workpiece are in proximity to the workpiece center line and workpiece periphery. At intermediate pressure ranges, in the 10 to 100 mTorr range, gas phase collisions of electrons, ions, and neutrons in the plasma prevent substantial diffusion of the plasma charged particles outside of the torroidal region. As a result, there is a relatively high plasma flux in a ring like region of the workpiece but low plasma fluxes in the center and peripheral workpiece portions.

These differing operating conditions result in substantially large plasma flux (i.e., plasma density) variations between the ring and the volumes inside and outside of the ring, as well as at different angles with respect to a center line of the chamber that is at right angles to the plane of the workpiece holder. These plasma flux variations result in a substantial standard deviation, i.e., in excess of three, of the plasma flux incident on the workpiece. The substantial standard deviation of the plasma flux incident on the workpiece has a tendency to cause non-uniform workpiece processing, i.e, different portions of the workpiece are etched to different extents and/or have different amounts of molecules deposited on them.

Many coils have been designed to improve the uniformity of the plasma. The commonly assigned U.S. Pat. No. 5,759,280, Holland et al., issued Jun. 2, 1998, discloses a coil which, in the commercial embodiment, has a diameter of 12 inches and is operated in conjunction with a vacuum chamber having a 14.0 inch inner wall circular diameter. The coil applies magnetic and electric fields to the chamber interior via a quartz window having a 14.7 inch diameter and 0.8 inch uniform thickness. Circular semiconductor wafer workpieces are positioned on a workpiece holder about 4.7 inches below a bottom face of the window so the center of each workpiece is coincident with a center line of the coil and the chamber center line.

The coil of the '280 patent produces considerably smaller plasma flux variations across the workpiece than the coil of the '458 patent. The standard deviation of the plasma flux produced by the coil of the '280 patent on a 200 mm wafer in such a chamber operating at 5 milliTorr is a considerable improvement over the standard deviation for a coil of the '458 patent operating under the same conditions. The coil of the '280 patent causes the magnetic field to be such that the plasma density in the center of the workpiece is greater than in an intermediate part of the workpiece, which in turn exceeds the plasma density in the periphery of the workpiece. The plasma density variations in the different portions of the chamber for the coil of the '280 patent are much smaller than those of the coil of the '458 patent for the same operating conditions as produce the lower standard deviation.

Other arrangements directed to improving the uniformity of the plasma density incident on a workpiece have also concentrated on geometric principles, usually concerning coil geometry. See, e.g., U.S. Pat. Nos. 5,304,279; 5,277,751; 5,226,967; 5,368,710; 5,800,619; 5,401,350; 5,558,722 and 5,795,429. However, these coils have generally been designed to provide improved radial plasma flux uniformity and to a large extent have ignored azimuthal plasma flux uniformity. In addition, the fixed geometry of these coils does not permit the plasma flux distribution to be changed for different processing recipes. While we are aware that the commonly assigned copending U.S. application of John Holland for "Plasma Processor with Coil Responsive to Variable Amplitude RF Envelope," Ser. No. 09/343,246, filed Jun. 30, 1999, and Gates U.S. Pat. No. 5,731,565 disclose electronic arrangements for at will controlling plasma flux uniformity for different recipes, the Holland and Gates inventions are concerned primarily with radial, rather than azimuthal, plasma flux uniformity. In the Holland invention, control of the plasma flux uniformity is achieved by controlling a variable amplitude envelope the RF excitation source applies to the coil. In the Gates invention a switch or a capacitor shunts an interior portion of a spiral-like RF plasma excitation coil.

It is accordingly an object of the present invention to provide a new and improved coil for a vacuum plasma processor and method of operating same wherein plasma flux in the processor is relatively uniform.

An additional object of the present invention to provide a new and improved coil for a vacuum plasma processor and method of operating same wherein the plasma density incident on a workpiece of the processor has relatively high azimuthal uniformity.

A further object of the invention is to provide a new and improved coil for a plasma processor, wherein the amplitude variations of standing waves (voltages and/or currents) in the coil are substantially reduced.

SUMMARY OF THE INVENTION

In accordance with one aspect of the invention, a coil for a plasma generator of a processor for treating a workpiece includes (1) first and second RF excitation terminals, (2) sufficient length to exhibit transmission line effects for RF excitation of the coil and (3) a capacitor connected to internal locations of the coil on different sides of a discontinuity in the coil. The plasma generator includes a chamber having an inlet for introducing into the chamber a gas which can be converted into the plasma. The coil is adapted to be positioned to couple an RF field to the gas for exciting the gas to the plasma state.

Preferably, the capacitor has an impedance value for the RF excitation such as to cause sudden changes at the location of the discontinuity in amplitude, slope and slope direction of an RF standing wave along the coil.

In the preferred embodiment, (1) the capacitor has an impedance value for the RF excitation, (2) the discontinuity has a location, and (3) the circuitry for supplying the RF excitation to the coil are such that the standing wave voltage along the coil has a voltage polarity change at the location of the discontinuity.

The RF excitation circuitry preferably includes another capacitor and a matching circuit in series with an inductor. The series combination of the matching circuit and the inductor are connected between a first coil excitation terminal and an RF source. The other capacitor is connected between a second coil excitation terminal and a reference potential terminal. The inductor and other capacitor have values for causing approximately equal magnitude and opposite polarity standing wave RF voltages to be at the first and second excitation terminals.

The coil preferably includes plural internal discontinuities and a capacitor is connected to the coil across each discontinuity. Each of the capacitors has an impedance value for the RF excitation such as to cause along the coil, at the location where each discontinuity is located, sudden changes in RF standing wave voltage amplitude, slope and slope direction. Each capacitor has an impedance value for the RF excitation, each discontinuity has a location, and the circuitry for supplying the RF excitation to the coil are such as to cause the standing wave voltage to have a voltage polarity change at the location of each discontinuity.

Preferably the coil includes plural turns. The excitation circuitry and the locations of the discontinuities are such that standing wave voltage polarity reversals occur at locations along the coil displaced from the locations of the discontinuities. The polarity reversals are approximately at the same azimuth angle of the coil in different ones of the turns.

Another aspect of the invention relates to a method of operating a coil that applies an RF plasma excitation field to an ionizable gas. The RF field ionizes the gas to the plasma. The coil has transmission line effects so there is an RF standing wave along the coil between opposite RF excitation terminals of the coil. The method comprises (1) applying an RF excitation voltage to opposite RF excitation terminals of the coil, and (2) suddenly changing by a substantial amount the RF standing wave amplitude and slope and the RF standing wave slope direction at a location along the coil between the excitation terminals.

Preferably, the method also includes suddenly changing the RF standing wave amplitude and slope and the RF standing wave slope direction at plural locations along the coil between the excitation terminals. Each sudden change is such as to reverse the polarity of the RF standing wave.

The RF excitation is preferably applied such that there are approximately equal magnitude and opposite polarity standing wave voltages at the opposite RF excitation terminals.

The method is preferably practiced with a coil having plural turns. The method preferably includes causing the standing wave to have gradual changes in at least some of the plural turns and the sudden changes along at least some of the plural turns. The gradual and sudden polarity reversals along some of the turns preferably are at substantially the same coil azimuthal angle and in the opposite direction at substantially the same azimuthal angle of the coil. A first gradual polarity reversal and a first sudden polarity reversal occur along a first turn, while a second gradual polarity reversal and a second sudden polarity reversal occur along a second turn. The first gradual and second sudden polarity reversals are at substantially the same first azimuth angle of the coil, while the second gradual and first sudden polarity reversals are at substantially the same second azimuth angle of the coil. The polarity reversals occur at azimuthal angles that are equally displaced from each other. One of the turns has a gradual polarity reversal at an azimuth angle different from the sudden polarity reversals.

In accordance with one embodiment of the invention, a variable shunt capacitor is connected to the coil and a variable capacitor is connected in series across a coil discontinuity. The capacitances of the variable capacitors are preferably varied to control the standing wave current and voltage in the two coil segments that are connected together by the series capacitor. To facilitate such control, one electrode of the shunt capacitor is preferably connected to an electrode of the series capacitor. The shunt capacitor creates a standing wave current discontinuity along the coil without introducing a discontinuity in the standing wave voltage along the coil. The series capacitor creates a standing wave voltage discontinuity along the coil without introducing a discontinuity in the standing wave current along the coil.

The previously mentioned Gates patent differs from the present invention because in Gates a capacitor shunts a part of the coil, rather than being connected across a discontinuity of the coil. The Gates patent does not indicate the shunt capacitor causes a sudden slope reversal of a standing wave voltage along the coil. The implication is that the shunt capacitor, which reduces the electromagnetic field in a center portion of the coil, does not reverse the standing wave voltage slope direction. If the shunt capacitor had a large enough value to reverse the standing wave voltage slope direction, no RF electromagnetic field would be derived from the shunted portion of the coil and one of the purposes of FIG. 3 of the Gates patent, i.e., to derive an RF electromagnetic from a center portion of the coil, would be defeated. Also, the Gates shunt capacitor causes increased current variations in different parts of the coil because the current in the coil portion not shunted by the capacitor is responsive to the sum of the currents flowing out of the capacitor and the coil portion the capacitor shunts. The increased coil current variations have a tendency to produce plasma density non-uniformity.

The above and still further objects, features and advantages of the present invention will become apparent upon consideration of the following detailed descriptions of plural specific embodiments thereof, especially when taken in conjunction with the accompanying drawings.

DETAILED DESCRIPTION OF THE DRAWING

Figure 1:
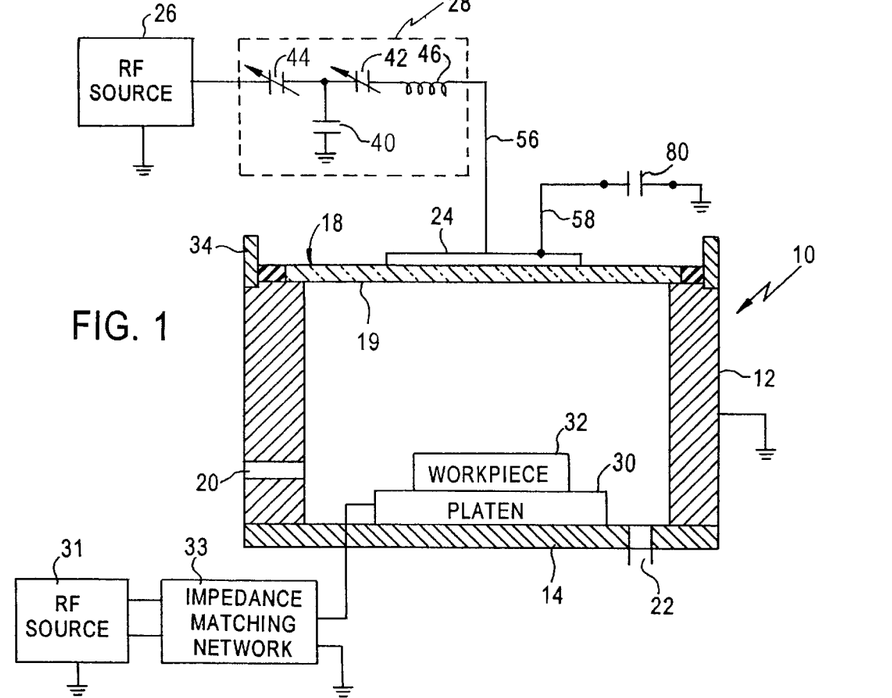
FIG. 1 is a schematic diagram of a plasma processor including a coil according to the present invention.

The vacuum plasma workpiece processor of FIG. 1 of the drawing includes vacuum chamber 10, shaped as a cylinder having grounded metal wall 12, metal bottom base plate 14, and circular top plate structure 18, consisting of a dielectric window structure 19, having the same thickness from its center to its periphery. Sealing of vacuum chamber 10 is provided by conventional gaskets (not shown). The processor of FIG. 1 can be used for etching a semiconductor, dielectric or metal substrate or for depositing molecules on such substrates.

A suitable gas that can be excited to a plasma state is supplied to the interior of chamber 10 from a gas source (not shown) via port 20 in side wall 12. The interior of the chamber is maintained in a vacuum condition, at a pressure that can vary in the range of 1–100 milliTorr, by a vacuum pump (not shown), connected to port 22 in base plate 14.

The gas in the chamber is excited to a plasma having a spatially substantially uniform density by a suitable electric source. The electric source includes a substantially planar coil 24, mounted immediately above window 19 and excited by RF power source 26, typically having a fixed frequency of 13.56 MHz.

Impedance matching network 28, connected between output terminals of RF source 26 and excitation terminals of coil 24, couples the output power that RF source derives to the coil. Impedance matching network 28 includes variable capacitors 42 and 44 and fixed capacitor 40 connected in a "T" network so one electrode of series capacitor 44 is connected to an output terminal of RF source 26, while the other terminal of capacitor 44 is connected to a common terminal of series capacitor 42 and shunt capacitor 40. A controller (not shown) varies the values of capacitors 42 and 44 in a known manner to achieve impedance matching between source 26 and a load including coil 24, terminating capacitor 80, and the plasma load the coil drives.

Workpiece 32 is fixedly mounted in chamber 10 to a surface of workpiece holder (i.e., chuck) 30; the surface of holder 30 carrying workpiece 32 is parallel to the surface of window 19. Workpiece 32 is usually electrostatically clamped to the surface of holder 30 by a DC potential of a DC power supply (not shown). RF source 31 supplies an RF voltage, usually 13.56 MHz, to impedance matching network 33, that includes variable reactances (not shown). Matching network 33 couples the output of source 31 to holder 30. A controller (not shown) controls the variable reactances of matching network 33 to match the impedance of source 31 to the impedance of an electrode (not shown) of holder 30. The load coupled to the electrode is primarily the plasma in chamber 10. As is well known the RF voltage that source 31 applies to the electrode of holder 30 interacts with charge particles in the plasma to produce a DC bias voltage on workpiece 32.

Surrounding planar coil 24 and extending above top end plate 18 is a metal tube or can-like shield 34 having an inner diameter somewhat greater than the inner diameter of wall 12. Shield 34 decouples electromagnetic fields originating in coil 24 from the surrounding environment. The distance between shield 34 and the peripheral regions of coil 24 is large enough to prevent significant absorption by shield 34 of the magnetic fields generated by the peripheral regions of coil 24.

The diameter of cylindrically shaped chamber 10 is large enough to prevent absorption by chamber walls 12 of the magnetic fields generated by the peripheral regions of coil 24. The diameter of dielectric window structure 19 is greater than the diameter of chamber 10 to such an extent that the entire upper surface of chamber 10 is comprised of dielectric window structure 19. The distance between the treated surface of workpiece 32 and the bottom surface of dielectric window structure 19 is chosen to provide the most uniform plasma flux on the exposed, processed surface of the workpiece. For a preferred embodiment of the invention, the distance between the workpiece processed surface and the bottom of the dielectric window is approximately 0.3 to 0.4 times the diameter of chamber 10; the inner diameter of chamber 12 is 14 inches, the diameter of coil 24 is 12 inches, the inner diameter of cylindrical shield 34 is 14.7 inches, and the distance between the workpiece processed surface and the bottom of the dielectric window is 4.7 inches.

Planar coil 24 functions as a transmission line to produce standing wave voltage and current patterns along the length of the coil. The standing wave patterns result in variations in the magnitude of the peak-to-peak RF voltages and currents along the length of the coil. The dependence of the electric and magnetic fields generated by the coil on the magnitude of these RF voltages and currents results in differing amounts of plasma being produced in different portions of chamber 10 beneath different portions of the coil.

The variations in the RF current magnitude flowing in different parts of the coil and of the RF voltages between different parts of the coil and between the coil and ground are spatially averaged to assist in deriving a uniform plasma. Spatially averaging these different current values in the different parts of the coil substantially reduces non-radial asymmetries in the plasma density, particularly at regions of high RF current in the coil segments near the coil periphery. The transmission line behavior of the RF current in prior art planar coils increases the amount of magnetic flux generated by the peripheral coil segments relative to the center coil segments. In the present invention coil 24 is arranged (as described infra) so there is a relatively uniform standing wave voltage distribution along the coil and a relatively uniform azimuthal distribution of plasma flux on the workpiece.

The center portion of coil 24 includes first and second excitation terminals respectively coupled by leads 58 and 56 to opposite terminals of RF source 26 via (1) the series combination of matching network 28, including inductor 46, and (2) one electrode of capacitor 80, the other electrode of which is grounded. Inductor 46, having an inductive impedance ($Z_L$=j2πfL) at the excitation frequency (f) of source 26, and capacitor 80, having a capacitive impedance $Z_{cap}$=1/(j2πfC) (where j=√−1, L is the inductance of inductor 46, and C is the capacitance of capacitor 80), shift the amplitude and location of the voltage and current standing waves across the entire length of coil 24. The standing wave voltage and current distribution are shifted in coil 24 by inductor 46 and capacitor 80 so the standing wave voltages at the first and second excitation terminals of the coil are approximately equal in magnitude but have opposite polarity. Coil 24 produces RF electric and magnetic fields which provide substantially uniform plasma flux on the processed surface of workpiece 32.

The locations of the standing wave voltage and current in coil 24 are controlled by selecting the values of inductor 46 and capacitor 80 so the peak-to-peak RF currents at the coil excitation terminals are approximately equal and have minimum values. In one preferred embodiment, the inductance of inductor 46 and the capacitance of capacitor 80 are selected to achieve $Z_L$=+100j ohms and $Z_{cap}$=−100j ohms. At this condition, coil 24 has opposite polarity maximum peak-to-peak (i.e., standing wave) RF voltages at its first and second excitation terminals. The function performed by inductor 46 can be achieved by increasing the inductance of coil 24, and/or by changing the nominal values of capacitor 40, in which cases inductor 46 is eliminated.

Figure 2:
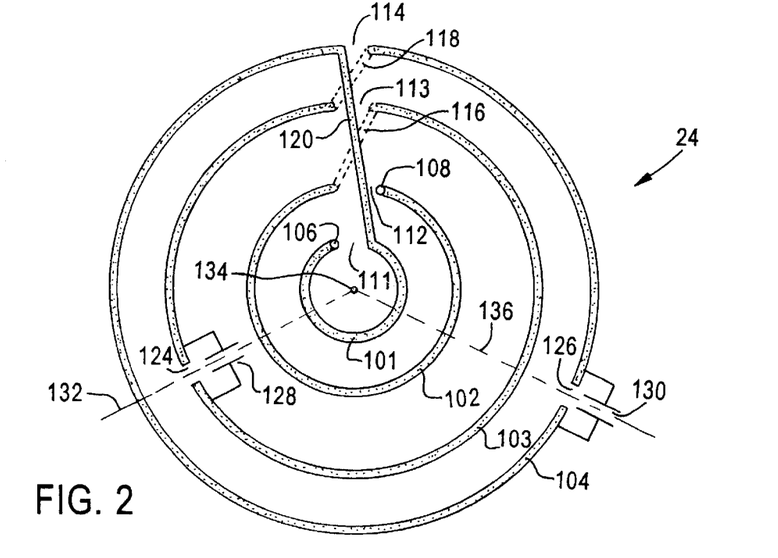
FIG. 2 is a front view of one preferred embodiment of a spiral-like coil including series capacitors in accordance with the present invention.

As illustrated in FIG. 2 in one preferred embodiment, spiral-like coil 24 includes four circular, substantially flat, coaxial turns 101, 102, 103 and 104, such that the radius of each circular turn increases as the reference numeral of the turn increases, such that in one exemplary coil turns 101, 102, 103 and 104 respectively have diameters of about 9.5 cms, 17 cms, 31 cms and 39 cms. Coil 24 includes two interior excitation terminals 106 and 108, respectively at opposite ends of turns 101 and 102. Terminal 108 is connected to the one end of inductor 46, while terminal 106 is connected to the ungrounded electrode of capacitor 80.

Each of turns 101–104 has an angular extent of approximately 350°, so that turns 101–104 respectively have gaps 111–114 between opposite ends thereof. Metal strap 116 electrically connects opposite ends of turns 102 and 103 to each other, while metal strap 118 electrically connects opposite ends of turns 103 and 104 to each other. Straps 116 and 118 extend in generally the same direction, outwardly from the left end of the inner winding to the right end of the outer winding. Metal strap 120, which extends in the opposite angular direction from straps 116 and 118, electrically connects the right end of turn 101 to the left end of turn 104. Turns 101–104 and metal straps 116 and 118 are in generally the same plane which is different from a plane including strap 120. Strap 120 is in a plane farther from window 18 than the plane occupied by turns 101–104 and straps 116 and 118. Straps 116, 118 and 120 traverse a region occupied by gaps 111–114, to assist in minimizing cross coupling of current flowing in the straps and current flowing in turns 101–104.

The capacitances of capacitors 40, 42, 80, 128 and 130 and the inductances of coil 24 and inductor 46 are such that they form a series circuit that is approximately resonant to the frequency of source 26. Consequently, there is considerably greater RF current flowing in the series circuit including components 24, 40, 42, 46, 80, 128 and 130 than flows from source 26 into capacitor 44 and the sum of the voltages across coil 24 and inductor 46 is approximately equal to and of opposite polarity to the sum of the voltages across capacitors 40, 42, 80, 128 and 130. Variable capacitor 42, referred to as the tune capacitor, is adjusted to achieve the series resonant condition.

To reduce the total standing wave voltage along coil 24 between terminals 106 and 108, discontinuities 124 and 126 (typically having lengths of about 1 cm) are respectively provided in turns 103 and 104. Discontinuities 124 and 126 are respectively connected to opposite terminals (i.e., electrodes) of discrete capacitors 128 and 130. The azimuthal angle of discontinuities 124 and 126 differ from each other by approximately 120°. Discontinuity 126 is approximately 120° from the intersection of strap 118 and the right end of turn 104, while discontinuity 124 is approximately 120° from the intersection of strap 118 and the left end of turn 103.

The locations of discontinuities 124 and 126, as well as capacitors 128 and 130, in coil 24, and the impedance values of the capacitors at the frequency of source 26 are such that there are a sudden amplitude change, sudden slope changes, sudden polarity reversal and sudden change in slope direction of the standing wave voltage along coil 24 at the location of each discontinuity. In a preferred embodiment, the capacitances of capacitors 128 and 130 are equal so each provides an impedance at the frequency of source 26 equal to −j100 ohms. The standing wave voltages have equal and opposite values on opposite electrodes of each of capacitors 128 and 130. Turn 103 has a gradual standing wave voltage polarity reversal at approximately the same azimuth angle as the azimuth angle where discontinuity 126 is located, while turn 104 has a gradual standing wave voltage polarity reversal at approximately the same azimuth angle as discontinuity 124. Hence, there are oppositely directed standing wave voltage reversals in adjacent turns 103 and 104 along line 132 that extends radially from center point 134 of coil 24 through discontinuity 124, as well as oppositely directed standing wave voltage reversals in adjacent turns 103 and 104 along line 136 that extends radially from center point 134 through discontinuity 126; lines 132 and 136 are displaced about 120° from each other and about 120° from the centers of gaps 111–114.

The 1⅔ turns, defined by all of inner turn 101 (starting at terminal 106 which is connected to the ungrounded electrode of capacitor 80) and two-thirds of a turn of outer turn 104 to discontinuity 126 has, in a preferred embodiment, a net inductive impedance at the frequency of source 26 of +j150 ohms. The two-thirds of a turn of coil 24 between discontinuities 124 and 126, defined by one-third of a turn of turn 103 and one-third of a turn of turn 104, has in the preferred embodiment, net inductance at the frequency of source 26 of +j100 ohms. The 1⅔ turns of coil 24 from discontinuity 124 to terminal 108 (connected to one end of inductor 46) defined by all of turn 102 and two-thirds of turn 103, has an impedance at the frequency of source 26 of +150j ohms. Representative impedance values of capacitors 40, 42 and 44 of matching circuit 28 at the excitation frequency of source 26 are respectively −j150 ohms, −j50 ohms and −j100 ohms. Of course, if inductor 46 is excluded and its function is provided by coil 24 and/or capacitor 40, as described supra, the inductances of coil 24 and/or capacitors 40 and 44 differ from the previously stated values.

Figure 3:
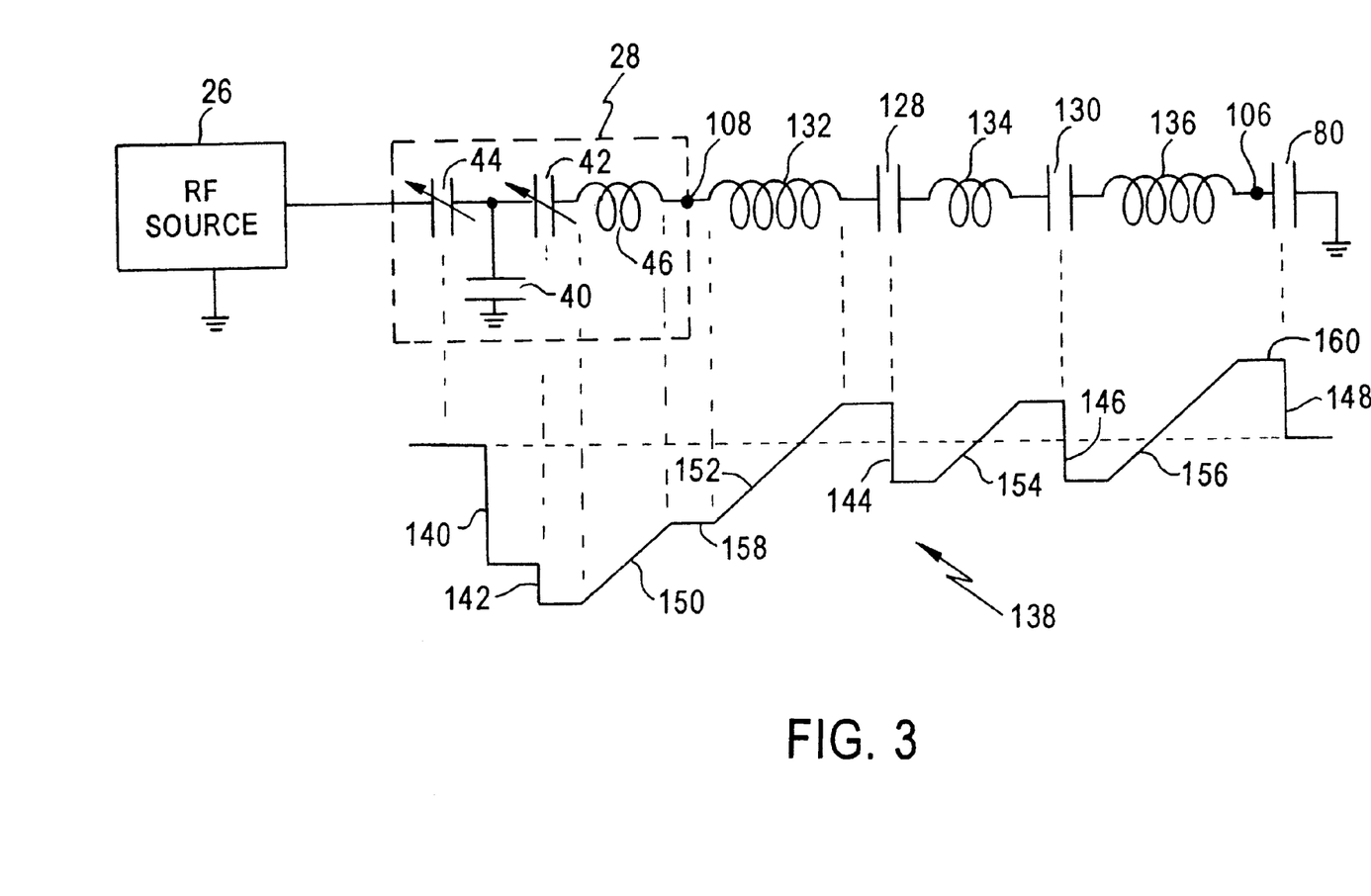
FIG. 3 includes a waveform plot of the amplitude of the standing wave RF voltage along the coil of FIG. 2 in alignment with the length of the coil and the circuitry driving the coil.

Using the aforementioned values, FIG. 3 is a plot of the standing wave voltages along the coil of FIG. 2 as driven by source 26, matching network 24, inductor 46 and capacitor 80. For purposes of explanation in FIG. 3, there is assumed to be a finite spacing between several portions of coil 24 and capacitors 128 and 130; in actuality no such spacing exists and the constant standing wave voltages of FIG. 3 in proximity to capacitors 128 and 130 do not exist. Coil segments 132, 134 and 136 respectively correspond to (1) all of turn 102 in series with two-thirds of turn 103, (2) one-third of turn 103 in series with one-third of turn 104, and (3) two-thirds of turn 104 in series with all of turn 101.

Waveform 138 represents the standing wave voltage of matching network 28, inductor 46, coil 24 and capacitors 80, 128 and 130, as a function of position. In FIG. 3, for explanation purposes, the voltage variations of waveform 138 are vertically aligned with the circuit components which produce the voltage variations. Hence, series capacitors 40, 42, 80, 128 and 130 respectively cause large, small, medium, medium and medium sudden decreases of voltage standing waves respectively indicated by negatively going, vertically extending step waveform portions 140, 142, 144, 146 and 148. Waveform portions 140, 142, 144, 146 and 148 are vertically aligned with capacitors 40, 42, 128, 130 and 80. Inductor 46 and coil segments 132, 134 and 136 respectively cause gradual upwardly sloping waveform portions 150, 152, 154 and 156. The voltage increases of waveform portions 150 and 154, respectively associated with inductor 46 and coil segment 134, are approximately equal and less than the approximately equal voltage increases of waveform portions 152 and 156 associated with coil segments 132 and 136.

The values of inductor 46 and capacitor 80 are such that the standing wave voltages 158 and 160 at opposite excitation end terminals 106 and 108 of coil 24 have approximately equal magnitude with opposite polarity, so the standing wave voltages of waveform portions 158 and 160 are respectively negative and positive. As discussed infra, this result can also be achieved by eliminating inductor 46 and increasing the inductance of coil 24 and/or changing the values of capacitor 40. The inductive impedance values of coil segments 132, 134, 136 at the frequency of source 26, the capacitive impedance values of capacitors 128 and 130 at the frequency of source 26 and the placement of the capacitors and the relations of voltages 158 and 160 cause each of gradual sloping wave portions 152, 154 and 156 to have a zero crossing point and each of step wave portions 144 and 146 to have a zero crossing point. The zero crossing point of wave portion 154 is in strap 118 connecting turns 103 and 104 at the mid-point of the length of coil 24 between terminals 106 and 108. The zero crossing points of wave portions 152 and 156 respectively occur in turns 103 and 104. The gradual zero crossing point of wave portion 152 in turn 103 is azimuthally aligned along radial line 136 with the zero crossing point across discontinuity 126 and capacitor 130 in outer turn 104, as indicated by step wave portion 146.

The gradual zero crossing point of wave portion 156 in outer turn 104 is azimuthally aligned along radial line 132 with the zero crossing point across discontinuity 124 and capacitor 128 in turn 103, as indicated by step wave portion 144.

Figure 4:
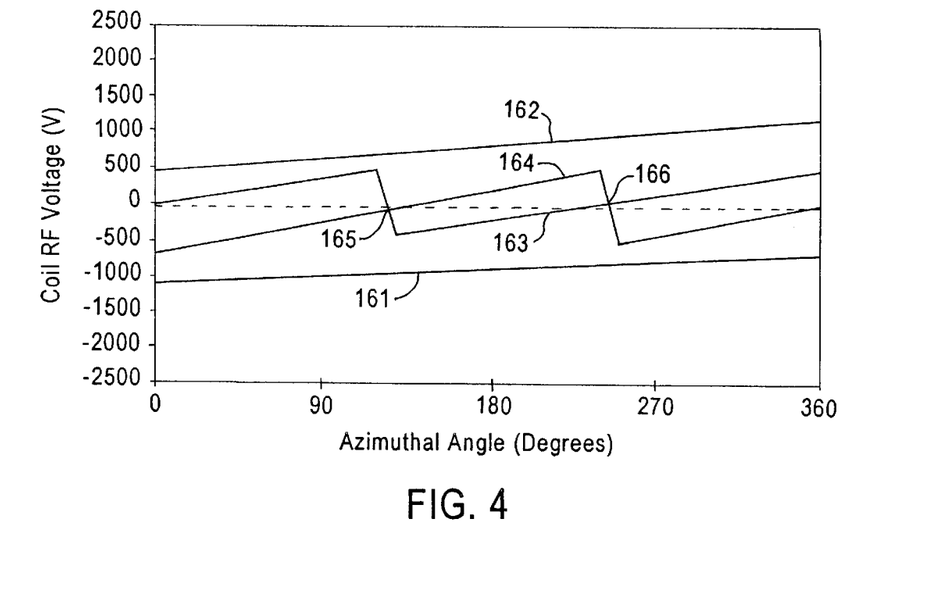
FIG. 4 includes waveform plots of standing wave voltage of each turn of the coil of FIG. 2, as a function of azimuth angle.

Waveforms 161, 162, 163 and 164 of FIG. 4 indicate the previously described azimuthal voltage variations in turns 101, 102, 103 and 104, respectively. Intersections 165 and 166 of waveforms 163 and 164 are the azimuthally aligned zero crossovers of turns 103 and 104 along radially extending lines 132 and 136, respectively. The intersections of waveform 163 with the 0° azimuth angle and of waveform 164 with the 360° azimuth angle is the gradual zero crossing in strap 118.

Inclusion of capacitors 128 and 130 reduces the total standing wave voltage variation along coil 24 between terminals 106 and 108. The standing wave voltages in windings 103 and 104 individually change only 65% as much as in a coil that is continuous between its excitation terminals and does not include capacitors 128 and 130. There is an average change of 40% of the standing wave voltages in turns 103 and 104 compared to a coil that is continuous between its excitation terminals and does not include capacitors 128 and 130. Capacitors 128 and 130 also cause a substantial reduction in current variation along the length of coil 24 compared to a coil that is continuous between its excitation terminals and does not include capacitors 128 and 130.

Waveforms 170 and 172 (FIG. 5) respectively plot voltage and current standing waves for a theoretical coil having the same geometry as the coil of FIG. 2, but which is continuous between terminals 106 and 108 and has no lumped parameter reactances, such as capacitors 128 and 130. Waveforms 170 and 172 are based on a drive circuit that includes capacitor 80, matching circuit 28 and capacitor 80, but excludes inductor 46. Voltage waveform 170 has approximately a straight line variation from about −1950 volts at one excitation terminal to about +1950 volts at the other excitation terminal. A single zero crossing is at the approximate center point along the length of the theoretical coil, i.e., half-way between the coil excitation terminals. Current waveform 172 has minima at the excitation terminals at about 65% of maximum value which occurs at the approximate center point along the length of the theoretical coil.

Figure 5:
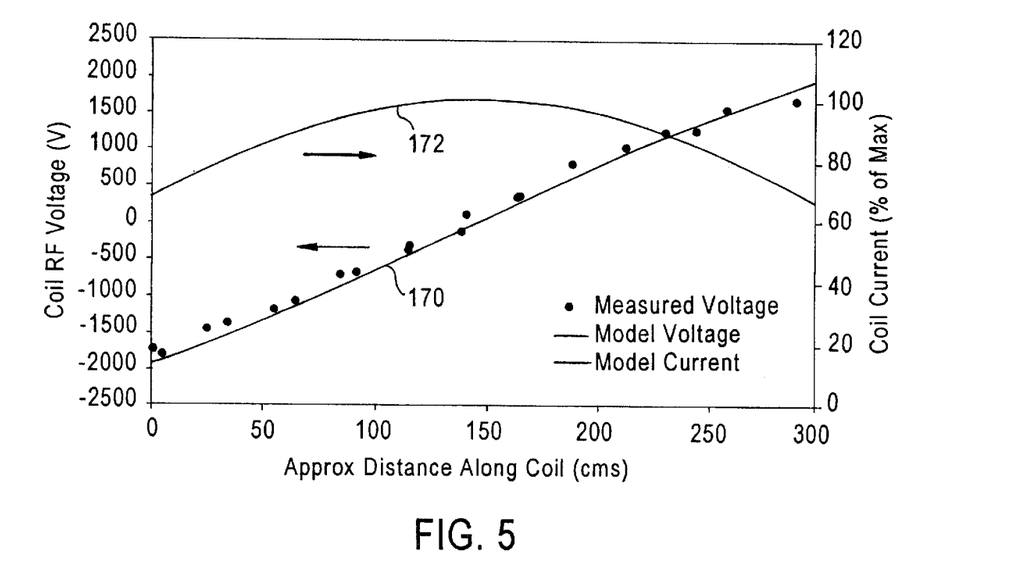
FIG. 5 includes waveform plots of the voltage and current standing waves versus coil length for a coil similar to the coil of FIG. 2, except that the similar coil is continuous with no lumped parameter impedances connected between the coil excitation terminals.
Figure 6:
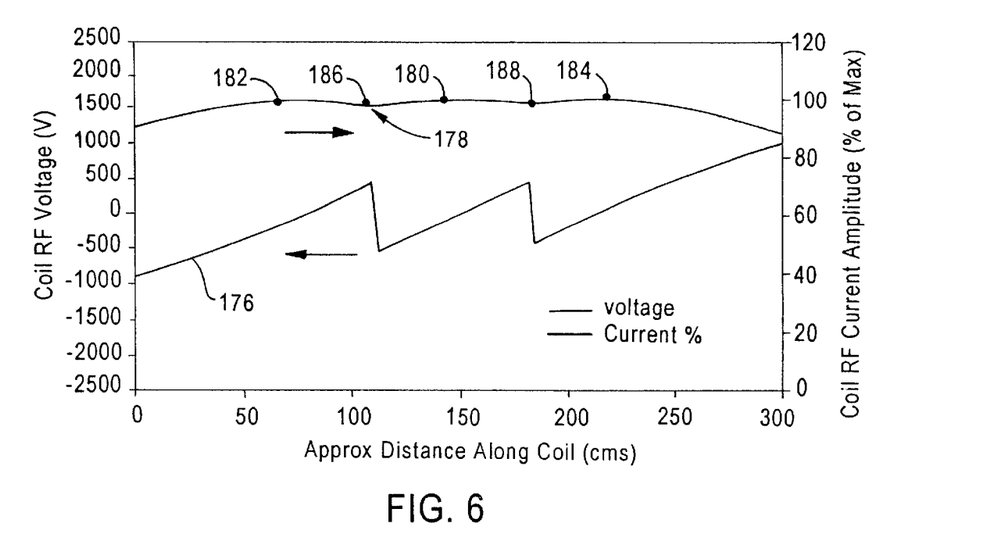
FIG. 6 includes waveform plots of standing wave voltage and current as a function of coil length when the coil of FIG. 2 is driven by the circuitry of FIG. 1.

Waveforms 170 and 172 are quite different from waveforms 176 and 178 (FIG. 6) which respectively represent the standing wave voltage and current variations along the length of coil 24, with capacitors 128 and 130 included. Standing wave voltage waveform 176 has amplitudes of about −900 volts and +900 volts at excitation terminals 108 and 106, respectively, and intermediate peak values of about +500 volts. Standing wave current waveform 178 has at terminals 106 and 107 minimum values of about 88% of peak value. There are three approximately equal peak values in standing wave current waveform 178, one in the coil center point 180, i.e., half-way along the coil length between its terminals 106 and 108, a second at point 182 about one-quarter of the coil length from terminal 106 and a third at about one-quarter of the coil length from terminal 108. Standing wave current minima occur at points 186 and 188 where capacitors 128 and 130 are respectively located.

Figure 7:
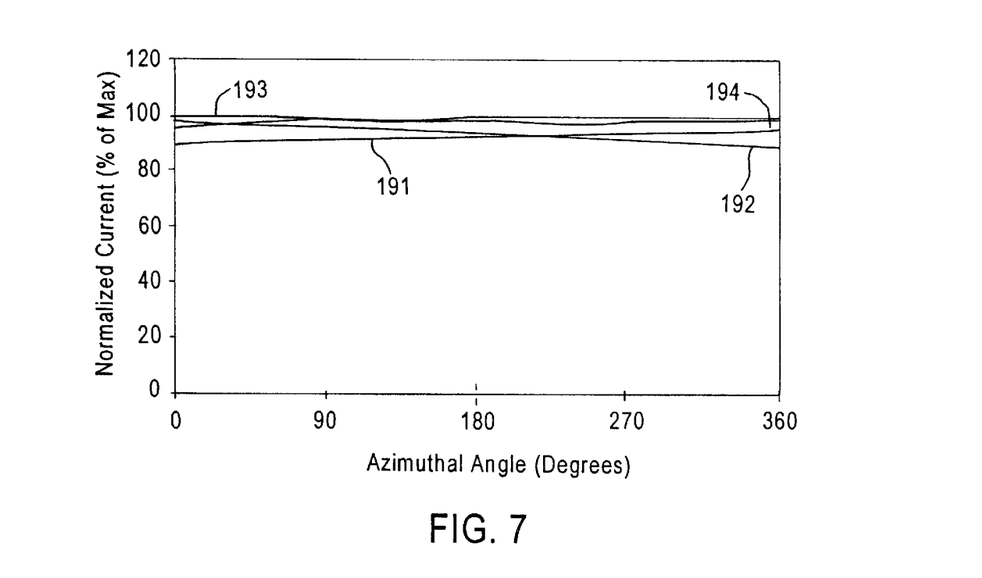
FIG. 7 is a plot of current distribution for the coil of FIG. 2, as a function of azimuthal angle.
Figure 8:
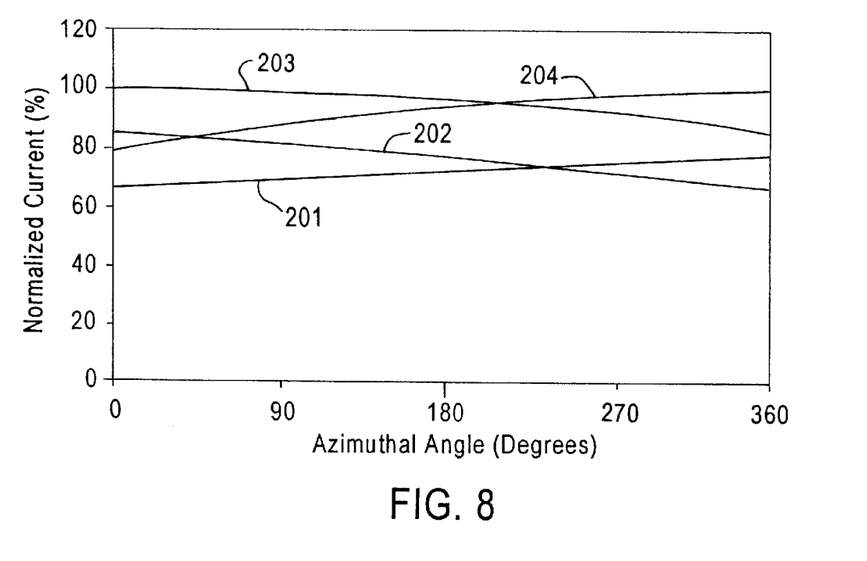
FIGS. 8 and 9 are respectively waveform plots of standing wave current and voltage variations as a function of azimuth angles for a coil similar to the coil of FIG. 2, except that the similar coil is continuous with no lumped parameter impedances connected between the coil excitation terminals.
Figure 9:
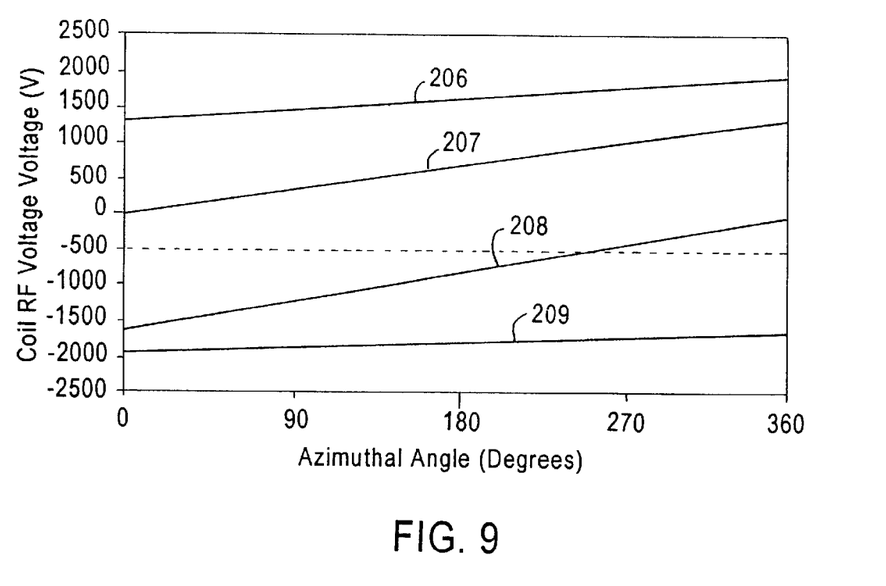

Waveforms 191, 192, 193 and 194 (FIG. 7) are respectively plots of the standing wave current variations in turns 101, 102, 103 and 104 of coil 24 including capacitors 128 and 130 as a function of azimuth angle. Waveforms 193 and 194 indicate that the standing wave currents in adjacent outer turns 103 and 104 are almost the same. The current distributions of FIG. 7 are to be compared with the substantial variation of the current distributions of waveforms 201, 202, 203 and 204 of FIG. 8 for the theoretical coil identical to coil 24, but having no discrete reactances and no discontinuites between its excitation terminals. The relatively low azimuthal standing wave voltage variations 161–164 of FIG. 4 are to be compared with the relatively large standing wave voltage variations of waveforms 206, 207, 208 and 209 of FIG. 9 for turns 101, 102, 103 and 104 of the theoretical coil having the same configuration as coil 24, but having no discrete reactances and no discontinuities between its excitation terminals.

Waveforms 176 and 178 indicate that the standing wave voltages and currents are balanced at the excitation terminals and at intermediate points along coil 26. The standing wave voltages and currents are considered to be balanced if the voltages at the coil terminals are equal in magnitude and opposite in polarity and if the currents at the coil terminals are equal in magnitude and polarity. In the theoretical coil of FIG. 5, having no discontinuities, such balancing occurs only once, as indicated by (1) the single peak of the standing wave current waveform 172 at the approximate mid-point of the coil, and (2) the continuous upward slope of standing wave voltage waveform 170. Standing wave voltage and current waveforms 176 and 178 of FIG. 6 indicate the discontinuous coil of FIG. 2 has three balanced segments; the first, second and third balanced segments are respectively in the ranges of about 60–120 cms, 120–180 cms and 180–240 cms from terminal 106. The first, second and third balanced segments have approximately equal minimum currents at the beginning and end points thereof, and maxima 182, 180 and 184 approximately at the centers thereof Each of the first, second and third balanced segments has an approximately equal negative standing wave voltage of about –400v. at the beginning thereof and an approximately equal positive standing wave voltage of about +400v. at the end thereof and a positive going zero crossing standing wave voltage in its center. These plural approximately balanced segments of the coil of FIG. 2 enable relatively uniform plasma density to be achieved, both radially and azimuthally. Because coil 24 including capacitors 128 and 130 has voltage and current standing waves with smaller variations in magnitude along the coil length, greater plasma flux uniformity, particularly as a function of azimuth angle, is achieved than is the case for the theoretical coil. Arranging the voltage nulls, i.e., zero crossovers or polarity reversals, to be aligned along radially extending lines 132 and 136, also contributes to azimuthal plasma flux uniformity.

Figure 10:
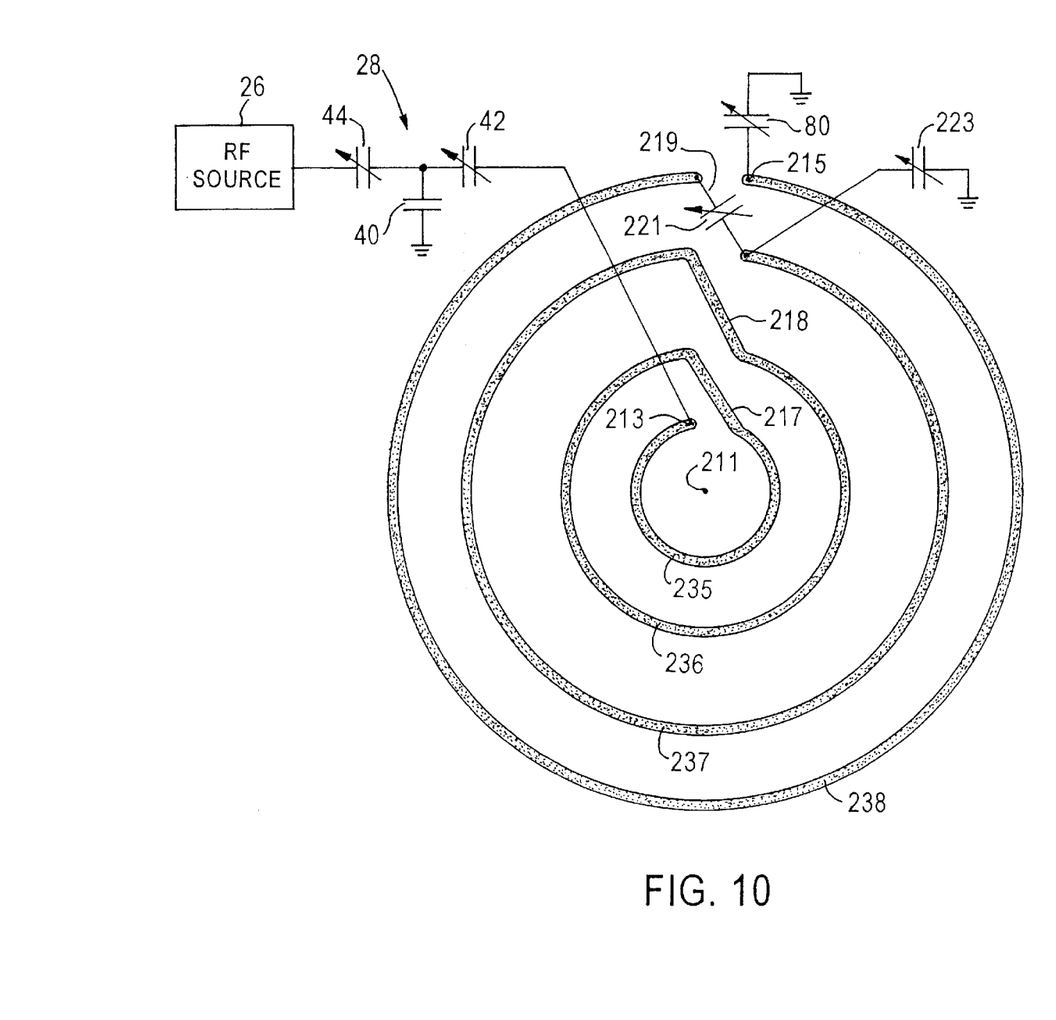
FIG. 10 is a top view of a modification of the coil of FIG. 2.

FIG. 10 is a top view of a modification of the coil of FIG. 2 which includes four concentric circular turns 235–238, coaxial with center point 211, such that the turns have progressively increasing radii as the reference numerals associated with them increase. Each of turns 235–238 has an angular extent of about 350° so there is a gap of about 10° in each of them. The coil of FIG. 10 includes interior and exterior excitation terminals 213 and 215, respectively connected to one electrode of capacitor 42 of matching circuit network 28 and the ungrounded electrode of capacitor 80, which is variable when used with the coil of FIG. 10. Inductor 46 is not included in the excitation circuit of the coil of FIG. 10. Terminals 213 and 215 are at opposite ends of turns 235 and 238. Metal strap 217 connects opposite ends of turns 235 and 236 together, while metal strap 218 connects opposite ends of turns 236 and 237 together. Thus, the coil of FIG. 20 is continuous from terminal 213 to the end of turn 237. The coil of FIG. 10 includes a discontinuity 219 between opposite ends of turns 237 and 238. The coil of FIG. 10 can be considered as having a first segment including turns 235, 236 and 237, and a second segment including turn 238.

Variable capacitor 221 bridges discontinuity 219, to provide a series connection of turns 235, 236 and 237 to turn 238. Variable shunt capacitor 223 is connected between the common terminals at the end of turn 237 and capacitor 221 and ground. The coil of FIG. 10 could be modified to include one or more additional discontinuities having series capacitors connected across them and one or more additional shunt capacitors.

Varying the value of capacitor 223 controls the amplitudes of the standing wave currents in the two segments of the coil of FIG. 10. Capacitor 223 causes a sudden decrease in the standing wave current flowing in the second coil segment compared to the standing wave-current in the first coil segment. Increasing and decreasing the value of capacitor 223 respectively cause decreases and increases in the shunt impedance across capacitor 223 and corresponding changes in the ratio of the amplitudes of the standing wave currents and voltages in the first and second coil segments. Variable capacitors 80, 221 and 223 enable balancing of the standing wave currents and voltages in the first and second coil segments. Balancing of the standing wave current in the first coil segment occurs when the standing wave currents at the end points of the first segment have about the same amplitude and polarity, with a peak current value about half-way between these end points. Balancing of the standing wave voltage in the first coil segment occurs when the standing wave voltages at the end points of the first segment are the same in amplitude and opposite in polarity with a zero voltage value occurring about half-way between these end points. Balancing of the standing currents and wave voltages in the second coil segment occurs under similar circumstances for the end points of the second coil segment.

Figure 11:
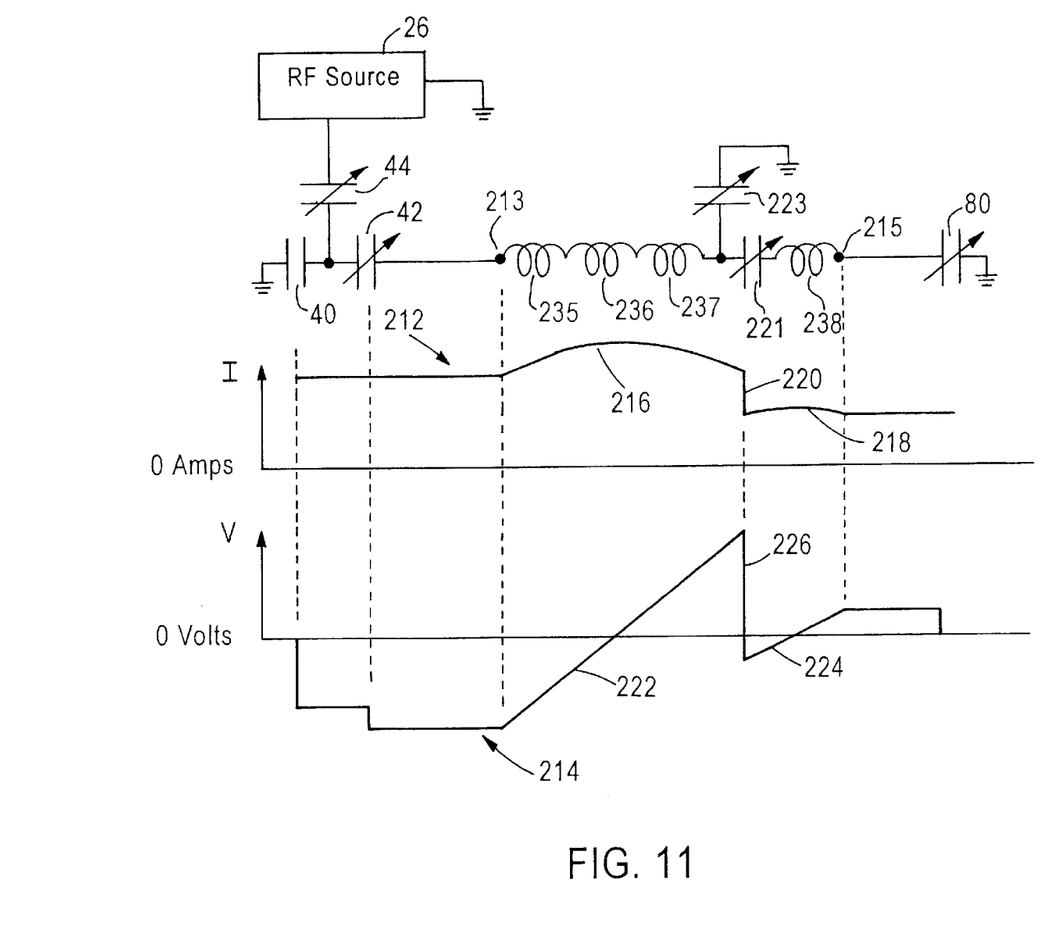
FIG. 11 includes waveform plots of the amplitudes of the standing wave current and voltage along the coil of FIG. 10 in alignment with the length of the coil and the circuitry driving the coil.

FIG. 11 includes plots of standing wave current and voltage waveforms 212 and 214, along the length of the coil of FIG. 10. Standing wave current waveform 212 includes segments 216 and 218, respectively along the first and second coil segments. Each of segments 216 and 218 has a peak value approximately at the center thereof and equal minimum amplitudes and like polarity at the opposite ends thereof. A sudden, almost step decrease 220 in the standing wave current occurs at shunt capacitor 223. Standing wave voltage waveform 214 includes upwardly directed segments 222 and 224 along the first and second coil segments, respectively. Segments 222 and 224 are separated by a sudden almost step decrease 226 across series capacitor 221. Segment 222 has a greater slope than segment 224 because more current flows through the first coil segment than the second coil segment. Segment 222 has equal amplitude and opposite polarity voltages at opposite ends thereof and a zero crossing approximately at its center. A similar situation exists for segment 224. Because of shunt capacitor 223, the standing wave voltage drop across capacitor 221, indicated by step 226, is not symmetrical with the zero standing wave voltage value. The positive voltage magnitude at the end of turn 237 exceeds the negative voltage magnitude at the beginning of turn 238.

Because the standing wave currents and voltages in the first and second coil segments are balanced, the electromagnetic fields the coil of FIG. 10 applies to the plasma can be controlled to assist in achieving relatively uniform plasma density.

While there have been described and illustrated plural specific embodiments of the invention, it will be clear that variations in the details of the embodiment specifically illustrated and described may be made without departing from the true spirit and scope of the invention as defined in the appended claims.

We claim:

1. A coil for a plasma generator of a processor for treating a workpiece, the plasma generator including a chamber having an inlet for introducing into the chamber a gas which can be converted into the plasma, the coil being adapted to be positioned to couple-an RF field to the gas for exciting the gas to the plasma state, the coil comprising first and second RF excitation terminals, the coil having sufficient length to exhibit transmission line effects for the RF excitation, and a capacitor connected to internal locations of the coil on different sides of a discontinuity in the coil.

2. The coil of claim 1 wherein the capacitor has an impedance value for the RF excitation such as to cause sudden changes at the location of the discontinuity in amplitude, slope and slope direction of an RF standing wave along the coil.

3. The coil of claim 2 further including the circuitry for supplying the RF excitation to the coil, wherein (a) the capacitor has an impedance value for the RF excitation, (b) the discontinuity has a location, and (c) the circuitry for supplying the RF excitation to the coil are such that the standing wave voltage along the coil has a voltage polarity change at the location of the discontinuity.

4. The coil of claim 1 wherein the circuitry for supplying the RF excitation to the coil includes another capacitor and a matching circuit, the matching circuit being connected between a first coil excitation terminal and a terminal for connection to an RF source, the another capacitor being connected between a second coil excitation terminal and a reference potential terminal, the circuitry for supplying the RF excitation having values for causing approximately equal magnitude and opposite polarity standing wave RF voltages to be at the first and second excitation terminals, the coil and capacitor connected to the coil causing equal magnitude and opposite polarity standing wave RF voltages to be at intermediate locations along the coil.

5. The coil of claim 4 wherein the circuitry for supplying the RF excitation includes an inductor in series with the matching circuit.

6. The coil of claim 1 wherein the coil includes plural internal discontinuities, a capacitor being connected to the coil across each discontinuity.

7. The coil of claim 6 wherein each of the capacitors has an impedance value for the RF excitation such as to cause in the coil at the location where each discontinuity is located sudden changes in RF standing wave voltage amplitude, slope and slope direction.

8. The coil of claim 7 further including circuitry for supplying the RF excitation to the coil, wherein (a) each capacitor has an impedance value for the RF excitation, (b) each discontinuity has a location, and (c) the circuitry for supplying the RF excitation to the coil are such as to cause the standing wave voltage to have a voltage polarity change at the location of each discontinuity.

9. The coil of claim 8 wherein the coil includes plural turns, the excitation circuitry and the locations of the discontinuities being such that standing wave voltage polarity reversals occur at locations in the coil displaced from the locations of the discontinuities, the polarity reversals being approximately at the same azimuth angle of the coil in different ones of the turns.

10. The coil of claim 1 further including a capacitor in shunt to a reference potential at an intermediate location along the coil.

11. The coil of claim 10 wherein the intermediate location is at the discontinuity.

12. The coil of claim 11 wherein both of the capacitors are variable.

13. A method of operating a coil that applies an RF plasma excitation field to an ionizable gas, the RF field ionizing the gas to the plasma, the method comprising applying an RF excitation voltage to opposite RF excitation terminals of the coil, the coil having transmission line effects so there is an RF standing wave along the coil between the opposite RF excitation terminals of the coil, and suddenly changing by a substantial amount the RF standing wave amplitude and slope and the RF standing wave slope direction at a location along the coil between the excitation terminals.

14. The method of claim 13 further including suddenly changing the RF standing wave amplitude and slope and the RF standing wave slope direction at plural locations along the coil between the excitation terminals.

15. The method of claim 14 wherein each of sudden changes is such as to reverse the polarity of the RF standing wave.

16. The method of claim 15 wherein the RF excitation is applied such that there are approximately equal magnitude and opposite polarity standing wave voltages at the opposite RF excitation terminals and at locations along the coil between the opposite excitation terminals.

17. The method of claim 14 wherein the RF excitation is applied such that there are approximately equal magnitude and opposite polarity standing wave voltages at the opposite RF excitation terminals and at locations along the coil between the opposite excitation terminals.

18. The method of claim 15 wherein the coil has plural turns, further including causing the standing wave to have gradual changes in at least some of the plural turns and the sudden changes in at least some of the plural turns, the gradual and sudden polarity reversals in some of the turns being at substantially the same coil azimuthal angle.

19. The method of claim 18 wherein the gradual and sudden polarity reversals occur in the opposite direction at substantially the same coil azimuthal angle.

20. The method of claim 19 wherein a first gradual polarity reversal and a first sudden polarity reversal occur along a first turn, and a second gradual polarity reversal and a second sudden polarity reversal occur along a second turn, the first gradual and second sudden polarity reversals being at substantially the same first azimuth angle of the coil, the second gradual and first sudden polarity reversals being at substantially the same second azimuth angle of the coil.

21. The method of claim 20 wherein polarity reversals occur at azimuthal angles that are equally displaced from each other.

22. The method of claim 21 wherein one of the turns has a gradual polarity reversal at an azimuth angle different from the sudden polarity reversals.

23. The method of claim 13 wherein the sudden change is such as to change the polarity of the RF standing wave.

24. The method of claim 23 wherein the RF excitation is applied such that there are approximately equal magnitude and opposite polarity standing wave voltages at the opposite RF excitation terminals and at locations along the coil between the opposite excitation terminals.

25. The method of claim 13 wherein the RF excitation is applied such that there are approximately equal magnitude and opposite polarity standing wave voltages at the opposite RF excitation terminals and at locations along the coil between the opposite excitation terminals.

26. A vacuum plasma processor for treating a workpiece with a plasma comprising a chamber having an inlet for introducing into the chamber a gas which can be converted into the plasma for treating the workpiece, a coil positioned to couple an RF field to the gas for exciting the gas to the plasma state, the coil having first and second RF excitation terminals, the coil having sufficient length to exhibit RF transmission line standing wave effects for the RF excitation along the coil between the coil excitation terminals, the coil being arranged so there are substantial sudden changes in the RF standing wave amplitude, slope, and slope direction in the RF standing wave at a location along the coil displaced from the excitation terminals.

27. The processor of claim 26 further including circuitry for supplying the RF excitation to the coil, the circuitry for supplying the RF excitation to the coil and the coil being such that the standing wave has a polarity change at said location.

28. The processor of claim 27 wherein the circuitry and the coil are arranged so there are plural substantial sudden changes in the RF standing wave amplitude, slope, and slope direction in the RF standing wave, each of the plural substantial changes being at a different location along the coil displaced from the excitation terminals.

29. The process of claim 28 wherein the standing wave has a sudden polarity change at each of said locations.

30. The processor of claim 29 wherein the coil includes plural turns, the coil and the excitation circuitry being arranged for causing the standing wave to have gradual changes along at least some of the plural turns and the sudden changes in at least some of the plural turns, the gradual and sudden polarity reversals along some of the turns being at substantially the same coil azimuthal angle.

31. The processor of claim 30 wherein the coil and the excitation circuitry are arranged for causing gradual and sudden polarity reversals to occur in the opposite direction at substantially the same coil azimuthal angle.

32. The processor of claim 31 wherein the coil and the excitation circuitry are arranged for causing a first gradual polarity reversal and a first sudden polarity reversal to occur along a first turn, and a second gradual polarity reversal and a second sudden polarity reversal to occur along a second turn, the first gradual and second sudden polarity reversals being at substantially the same first azimuth angle of the coil, the second gradual and first sudden polarity reversals being at substantially the same second azimuth angle of the coil.

33. The processor of claim 32 wherein the coil and the excitation circuitry are arranged for causing polarity reversals at azimuthal angles that are equally displaced from each other.

34. The processor of claim 33 wherein the coil and the excitation circuitry are arranged for causing one of the turns to have a gradual polarity reversal at an azimuth angle different from the sudden polarity reversals.

35. The processor of claim 27 wherein the coil has a discontinuity at each of the locations, a capacitor being connected to opposite sides of the discontinuity at each of the locations.

36. The processor of claim 26 wherein the coil has a discontinuity at the location, a capacitor being connected to opposite sides of the discontinuity at the location.

37. The processor of claim 36 further including a capacitor in shunt to a reference potential at an intermediate location along the coil.

38. The processor of claim 37 wherein the intermediate location is at the discontinuity.

39. The processor of claim 38 wherein both of the capacitors are variable.

* * * * *